United States Patent [19]
Patel

[11] Patent Number: 4,901,280
[45] Date of Patent: Feb. 13, 1990

[54] PULL-UP CIRCUIT FOR HIGH IMPEDANCE WORD LINES

[75] Inventor: Pravin Patel, Sugar Land, Tex.

[73] Assignee: Texas Instruments Incorporated, Dallas, Tex.

[21] Appl. No.: 342,584

[22] Filed: Apr. 19, 1989

Related U.S. Application Data

[63] Continuation of Ser. No. 207,915, Jun. 13, 1988, abandoned, which is a continuation of Ser. No. 884,565, Jul. 11, 1986, abandoned.

[51] Int. Cl.$^4$ .............................................. G11C 7/00
[52] U.S. Cl. ................................. 365/189.11; 365/203
[58] Field of Search ...................... 365/189.11, 189.06, 365/203, 204

[56] References Cited

U.S. PATENT DOCUMENTS

| 4,291,392 | 9/1981 | Pruebsting | 365/203 |
| 4,397,003 | 8/1983 | Wilson et al. | 365/203 X |
| 4,563,754 | 1/1986 | Aoyama et al. | 365/203 X |

Primary Examiner—Joseph A. Popek
Attorney, Agent, or Firm—Douglas A. Sorensen; Rodney M. Anderson; Melvin Sharp

[57] ABSTRACT

A circuit for assisting the charging of a line conductor having a distributed resistance and capacitance, such as a word line in a semiconductor memory device, is disclosed. In the conventional memory device, a driver circuit is disposed at one end of a word line, with a circuit for holding unselected word lines at the discharged voltage being disposed at the end of the word line opposite from the drive circuit. The invention is directed towards a pull-up circuit being disposed at the end of the word line opposite the driver circuit, the pull-up circuit having a transistor which is precharged to a high voltage prior to the active cycle. The precharged transistor is discharged as the selected word line is charged by the driver circuit, causing a driving node in the circuit to be connected to a high supply voltage. The driving node is connected to the word line by a transistor which is responsive to a select signal generated by the address decoder; once selected, the word line at the end opposite the driver circuit is driven by the high supply voltage. This will enable the selected word line to be pulled up to the high supply voltage at both ends, thereby reducing the time required to charge the word line to the required voltage level. The pull-up circuit may also include a transistor for holding the word line low, if unselected; this transistor is made non-conductive as the precharged transistor is discharged. Further disclosed is a circuit which allows a plurality of word lines to share the precharging and driving transistors, but which dedicates for each word line the "bleeder" transistor for holding unselected word lines low and the transistors for coupling the driving node to the word line. In addition, a circuit which provides a reduced voltage at the bleeder transistor, thereby speeding up the charging of the word line by the driver circuit, is disclosed.

20 Claims, 6 Drawing Sheets

PULL-UP CIRCUIT FOR HIGH IMPEDANCE WORD LINES

This application is a continuation of application Ser. No. 207,915, filed June 13, 1988, now abandoned which is a continuation of application Ser. No. 884,565 filed July 11, 1986 now abandoned.

BACKGROUND OF THE INVENTION

The invention relates to semiconductor integrated circuit devices, and specifically to a circuit for improving the speed in which a resistive and capactive conductor, such as the word line in a memory device, can be driven from one voltage to another.

In dynamic random access memories (DRAMs) constructed as generally shown in U.S. Pat. No. 4,081,701 (a 16k bit DRAM) issued to White, McAdams and Redwine and assigned to Texas Instruments, Inc., and in U.S. Pat. No. 4,239,993 (a 64k bit DRAM) issued to McAlexander, White and Rao and assigned to Texas Instruments, Inc. data is stored in a plurality of memory cells arranged in rows and columns, each storage cell consisting of a single capacitor, and the stored data state represented by either the presence or absence of charge stored by the capacitor. Each of the memory cells is connectable to a sense amplifier by means of a transfer gate which connects the storage capacitor to a bit line, with a given column of memory cells is generally associated with a common bit line. A given row of memory cells will be associated with a word line perpendicularly disposed to the bit line, with the word line of the selected row energizing one transfer gate with each bit line, thereby connecting one memory cell to each bit line.

In operation, the first step in the selection of an individual memory cell to which data is to be written, or from which data is to be read, is the selection of the row in which the desired memory cell resides, which is accomplished by presenting a row address in conjunction with a row address strobe signal to the memory device. The row address decoder on the device decodes the row address and, by means of a driver circuit, energizes the word line corresponding to the desired row, which causes each memory cell in the selected row to be connected to a bit line, and thereby sensed by the sense amplifiers. After this sensing, the desired cell is then addressed by presenting a column address to the device, in conjunction with a column address strobe signal, which is similarly decoded to choose the corresponding column. The speed by which a given memory cell may be accessed is determined by the sum of these operations, making it evident that if the time required to energize the cells in a given row increases, the overall time to access a given cell will increase accordingly. It should be noted that each transfer gate of the device presents a capacitive load to the word line driver, and that the word line itself presents a distributed resistance to the word line driver. It should therefore be apparent that the word line driver is driving an R-C load with a voltage step function, making the voltage waveform of a selected word line an exponential having a time constant proportional to the product of the resistance and the capacitance of the word line. Therefore, since it is desired that the word line drivers energize the transfer gates associated with the selected row as quickly as possible, it is desired that the resistance and capacitance which comprise the electrical load of the word line be minimized.

However, as the capacity of DRAM devices increases, certain factors tend to increase the load on the word line drivers of such devices, thereby tending to lengthen the time required in accessing a particular memory cell. As the capacity of such memory devices has increased, the number of rows and columns of memory cells has of course increased. However, since the sensing operation also serves to refresh the memory cells of the selected row in a DRAM, DRAM users prefer that the number of rows in succeeding generations of DRAMs remain the same, in order to keep constant the amount of overhead time required to periodically refresh the DRAM device. For example, a 64k bit DRAM generally contains 256 rows and 256 columns, while a 256k bit DRAM also generally contains 256 rows, but with 1024 columns in order to acheive the 256k bit capacity. Similarly, 1M bit DRAM devices are expected to contain 512 rows, but with 2048 columns, with the refresh period double that of the 256k DRAM. Therefore, as the capacity of memory devices increases, the number of transfer gates which a word line is required to drive is increasing at even a faster rate, as is the the capacitive load of the word lines. In addition, as the capacity of the memory devices increase, it is highly desirable that the surface area of the semiconductor decrease on a a per-memory-cell basis. A large factor in the surface area required for a given memory capacity is the width of the word line; therefore, it is desirable that the word line become as narrow as possible. It is well known that the resistance of a conductor is inversely proportional to its cross-sectional area, so that as the word line is narrowed, its resistance is increased accordingly, which further inreases the loading of the word line drivers as the memory capacity increases.

It is therefore an object of this invention to provide a pull-up circuit, at the end of the word line opposite the driver, which serves to minimize the time required to energize the word line.

It is another object of this invention to provide such a pull-up circuit which efficiently utilizes surface area on the semiconductor device, by sharing portions of the pull-up circuit among a plurality of word lines.

It is another object of this invention to provide a pull-up circuit which provides the above benefits and which serves to keep at a non-energized state those word lines associated with rows which are not selected.

Other benefits and advantages of the subject invention will become apparent after consideration of the description of the preferred embodiments contained herein.

SUMMARY OF THE INVENTION

A circuit is provided, using CMOS technology, and located at the end of the word line opposite from the word line driver, which responds to the voltage transition of the word line and to one of the decoded signals, to help pull the word line to its energized state. Specifically, a transistor responds to a precharge signal to cause a second transistor to precharge a control node to an energized state, prior to the decoding process. For the word line which is being selected by the row address decoder, as the word line voltage exceeds a transistor threshold voltage, a third transistor discharges the control node, which in turn causes a fourth transistor to pull up the word line from a power supply. The circuit of the invention may also provide a transistor which will assist holding unselected word lines to a non-energized (low voltage) state. An additional transistor is provided which allows the precharging and pull-up stages to be common for a plurality of word lines, by connecting only one of the word lines to the pull-up transistor, responsive to a signal from the row address decoder.

DETAILED DESCRIPTION OF THE INVENTION

Figure 1:
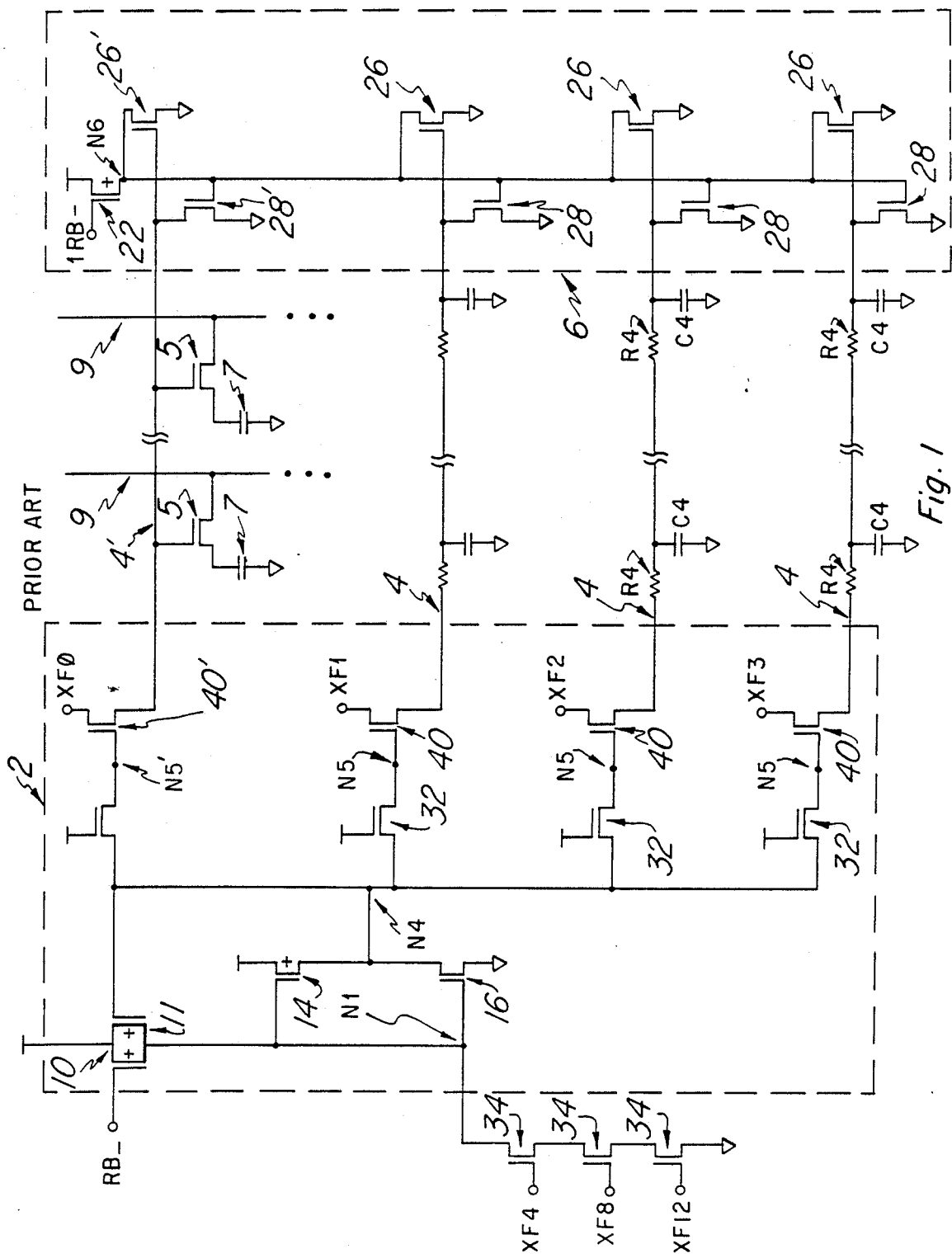
FIG. 1 is a schematic drawing of a typical row decoder and word line driver circuit, showing a bleeder circuit according to the prior art.

Referring to FIG. 1, word line driver circuit 2 is schematically shown for driving word lines 4 responsive to factor signals XF0 through XFn. Each word line 4 is used in memories of the type described above to energize transfer gates 5 which, when so energized, connect storage cells 7 of the memory to sensing circuits (not shown) via bit lines 9. FIG. 1 shows some of word lines 4 as having distributed capacitors $C_4$ and resistors $R_4$; capacitors $C_4$ and resistors $R_4$ represent the equivalent load circuit presented by the gate capacitance of transfer gates 5, and the resistance of word line 4 itself in discrete sections between each transfer gate 5. Word line driver circuit 2 drives word lines 4 from one end, with bleeder circuits 6 disposed at the other end of each word line 4 to ensure that unselected word lines 4 remain in their unselected state; bleeder circuit 6 shown in FIG. 1 is configured according to the prior art. It is apparent that each word line 4 presents an "open-ended" load to word line driver circuit 2, since word line 4 is driven from only one end. Other typical memory devices have configurations of word line driver circuit 2, word lines 4 and bleeder circuits 6 similar to that of FIG. 1, for which the invention described and claimed herein is similarly applicable. An example of such an alternate configuration is one which has word line driver circuit 2 disposed in the center of word line 4, simultaneously driving half of word line 4 in each of two directions, with bleeder circuit 6 disposed on each half of word line 4 at the end opposite from word line driver circuit 2.

Each of the rows of the memory is selectable responsive to a row address signal, with the selection carried out by means of factor signals XF0 through XFn, generated by a row address decoder (not shown) responsive to the row address signal. Lower factor signals XF0 through XF3 are generated from the two least significant row address bits in a one-of-four manner; depending upon the logic states of the two least significant row address bits, only one of the four lower factor signals XF0 through XF3 will be at a high logic state. By way of example, factor signal XF0 of FIG. 1 is in its high state when the least two significant row address bits are "0", factor signal XF1 of FIG. 1 is in its high state when the least significant row address bit is a "1" and the second least significant row address bit is a "0"; similarly, when the second least significant row address bit is a "1", factor signal XF2 will be in its high state when the least significant row address bit is a "0", and factor signal XF3 will be in its high state when the least significant row address bit is a "1". Higher factor signals XF4 through XFn are similarly generated by the row address decoder with each group of four factor signals corresponding to a pair of row address bits. For example, the logic states of the third least significant row address bit and the fourth least significant row address bit will determine which of factor signals XF4 through XF7 will be in its high state. For the 256k bit DRAM having 256, or $2^8$, rows as discussed above, the eight row address bits will thus generate the sixteen factor signals XF0 through XF15. Word line driver circuit 2 will drive a selected word line 4 based on the concurrent presence of the factor signals XF0 through XFn corresponding to the desired row. By way of example, in order for word line 4', which is associated with row address 0, to be selected, factor signals XF4, XF8, XF14, and XF0 must all be in their high logic state; these factor signals are representative of all row address bits being a "0".

Referring to FIG. 1, n-channel transistors 34 are connected with their source-to-drain paths in series, and with each of their gates connected to a higher factor signal. The drain of the top one of transistors 34 is connected, at node N1, to the gates of p-channel transistor 14 and n-channel transistor 16; transistors 14 and 16 are configured as a CMOS logic inverter, with the drains of transistors 14 and 16 connected together at node N4, with the source of transistor 14 connected to $V_{cc}$ and with the source of transistor 16 connected to ground. P-channel transistor 10 has its drain connected to node N1, has its source biased by $V_{cc}$, and has its gate controlled by precharge signal RB_. It should be noted that the designation _ following the signal designation, such as for RB$_{13}$, indicates that the designated signal is active in its low state. P-channel transistor 11 has its source-to-drain path connected in parallel with transistor 10, and its gate connected to node N4. Node N4 is connected to the sources of n-channel transistors 32 which, having their gates baised by $V_{cc}$ and their drains at a node N5 for each of word lines 4, will serve to isolate nodes N5 from node N4 for the selected row, as will be described below. Each of n-channel transistors 40 has its gate connected to one of nodes N5, and has its source connected to one of word lines 4. The drain of each of n-channel transistors 40 is controlled by the one of lower factor signals XF0 through XF3 associated with the particular one of word lines 4; by way of example, word line 4' is associated with lower factor signal XF0, via transistor 40'.

The end of each of word lines 4 opposite from word line driver circuit 2 is connected to the gate of an n-channel transistor 26 in bleeder circuit 6. Each of transistors 26 has its source connected to ground, and each has its drain connected to the drain of p-channel transistor 22, at node N6. Transistor 22 has its source biased by $V_{cc}$, and its gate controlled by precharge signal RB_. Also connected to node N6 are the gates of n-channel transistors 28, one for each of word lines 4; each transistor 28 has its source at ground and its drain connected to its associated one of word lines 4.

In operation, precharge signal RB_ is presented to word line driver circuit 2 during the precharge portion of the memory cycle, prior to the decoding of the row address by the row address decoder. Responsive to precharge signal RB__ going to its low state, p-channel transistor 10 is made conductive, causing node N1 to be charged to a high level, which turns off p-channel transistor 14 and turns on n-channel transistor 16, pulling node N4 to ground. Bleeder circuit 6 continues to hold word lines 4 low during precharge, since precharge signal RB__ appears at the gate of p-channel transistor 22, causing node N6 to be pulled toward $V_{cc}$. As node N6 is pulled high, n-channel transistors 28 conduct, keeping word lines 4 at ground. After precharge, precharge signal RB__ returns to a high level, but since node N4 is low, p-channel transistor 11 continues to conduct, so that node N1 remains pre-charged to a high level through transistor 14. Responsive to the row address presented to the row address decoder, the corresponding factor signals XF4 through XFn will be presented to word line driver circuit 2 prior to the presentation of factor signals XF0 through XF3. In the example shown in FIG. 1 relative to the selection of word line 4', factor signals XF4, XF8, and XF12 are driven to a high level prior to factor signal XF0. Once higher order factor signals XF4, XF8 and XF12, in this example, are at a high level, node N1 is discharged through n-channel transistors 34, causing n-channel transistor 16 to conduct and p-channel transistor 14 to be turned off, driving node N4 approximately to $V_{cc}$ and turning off transistor 11.

N-channel transistorS 32 isolate nodes N5 from node N4 as the lower factor signals XF0 through XF3 are energized, thereby serving to drive nodes N5 to a level above $V_{cc}$ through the well-known technique of "bootstrapping". As node N4 is charged to a voltage approximately at $V_{cc}$, nodes N5 will charge to a voltage approximately at $V_{cc}$ less the threshold voltage of transistor 32 ($V_t$), transistors 32 operating in the saturation region. Since the lower factor signals XF0 through XF3 are low at this time, the gate-to-drain capacitances of transistors 40 are also charged to $V_{cc}-V_t$. Selection of one row out of each group of four requires that one of the lower factor signals XF0 through XF3 be driven to a high level while the other lower factor signals remain low. By way of example, assuming that the row associated with word line 4' is to be selected, lower factor signal XF0 will go to $V_{cc}$, with the other lower factor signals XF1 through XF3 remaining low. Of course, since the gates of transistors 40 which are associated with unselected word lines 4 are charged high from transistors 14, lower factor signals XF1 through XF3 serve to further hold the associated word lines 4 to a low, unselected, level through transistors 40; it should also be noted that lower factor signal XF0 will also go to a high state for word line groups responsive to different higher factor signal combinations than the word line group containing word line 4', but since node N1 remains at a high state for such groups, nodes N4 and N5 associated with such groups will remain low and preclude energizing of all of word lines 4 in such groups, regardless of the state of the lower factor signals XF0 through XF3. Responsive to lower factor signal XF0 going to $V_{cc}$, the voltage at the gate of transistor 40' will be driven to approximately $2V_{cc}-V_t$; this is because the voltage across a capacitor cannot change instantaneously, and because the voltage of the gate-to-drain capacitance of transistor 40' was charged to $V_{cc}-V_t$ prior to the transition of lower factor signal XF0 from ground to $V_{cc}$. However, since the gate of transistor 32 is held at $V_{cc}$, and since node N4 is at $V_{cc}$, transistor 32' is turned off, because its gate voltage is not greater than the voltage of either node N4 or node N5 by more than the threshold voltage $V_t$. With transistor 32' turned off, the voltage of node N5' (i.e., the voltage at the gate of transistor 40'), is thereby isolated and will remain at a voltage greater than $V_{cc}-V_t$ for a period of time. Since the gate voltage of transistor 40' is greater than its drain voltage plus its threshold voltage, transistor 40' is operating in the triode region, causing the source of transistor 40' to fully reach the drain voltage, without the $V_t$ drop which would occur if the gate voltage of transistor 40' were not bootstrapped to a level greater than $V_{cc}+V_t$. This allows lower factor signal XF0 to source a full $V_{cc}$ level to word line 4' through transistor 40'. It should also be noted that lower factor signal XF0 may itself be bootstrapped to a voltage higher than $V_{cc}$, thereby providing a higher voltage drive to word line 4', as is well known in the art; the bootstrapping of node N5' will similarly operate to drive word line 4' to approximately the full level of the drive of lower factor signal XF0.

At the end of the active cycle, the selected word line 4' is discharged by lower factor signal XF0 going to a low state before the occurence of precharge signal RB__. Since node N1 is discharged through the action of higher factor signals XF4, XF8, and XF12, node N4 is high because of transistor 14 being on, which causes transistor 40' to remain on. Therefore, word line 4' is discharged to the low level of lower factor signal XF0, prior to the precharge of node N1 through transistor 10.

For those word lines 4 which are associated with a different combination of higher factor signals XF4 through XFn, and a different lower factor signal XF0 through XF3 (i.e., lower factor signals XF1, XF2, and XF3), than word line 4', and which therefore are unselected, the end of said word lines 4 at word line driver circuit 2 will be floating because transistor 40 is turned off for each of said word lines 4, node N4 remaining low due to node N1 remaining at its precharged state. Bleeder circuit 6 operates, via transistor 28, to hold these word lines 4 at a low level, insuring that transfer gates 5 associated with said word lines 4 are not energized by noise. Of course, for those word lines 4 which are associated with the same combination of higher factor signals XF4 through XFn as word line 4', since the lower factor signals XF1, XF2, and XF3 remain low, said word lines 4 are driven low through transistors 40, turned on by nodes N4 and N5 being high.

As discussed above, bleeder circuit 6 continues to hold word lines 4 low during precharge. As the active portion of the memory cycle begins, precharge signal RB__ returns to its high state, causing node N6 to float at its precharged high potential. After selection of the desired row by the energizing of a word line 4 (for purposes of this example, word line 4'), n-channel transistor 26' is turned on as the voltage on word line 4' is charged by word line driver 2 (specifically by lower factor signal XF0) to a voltage exceeding the threshold voltage of transistor 26'; those of transistors 26 which are associated with unselected ones of word lines 4 remain non-conductive. The energizing of the gate of transistor 26' causes node N6 to be discharged which, in turn, turns off transistor 28' associated with word line 4', preventing the charged voltage of word line 4' from being dissipated through transistor 28'. Those of transistors 28 which are associated with unselected ones of word lines 4 are similarly turned off as node N6 discharges, but since the associated word lines 4 are not being charged (transistors 40 holding said word lines 4 at the low level of lower factor signals XF1 through XF3), this is of no effect. However, the capacitive load of transfer gates 5 coupled to word line 4', and the resistance of word line 4' itself, as discussed above relative to resistors $R_4$ and capacitors $C_4$, cause delay in charging the end of word line 4' near bleeder circuit 6, a delay which directly impacts the access time for memory cells located at the end of word line 4' near bleeder circuit 6.

Figure 2:
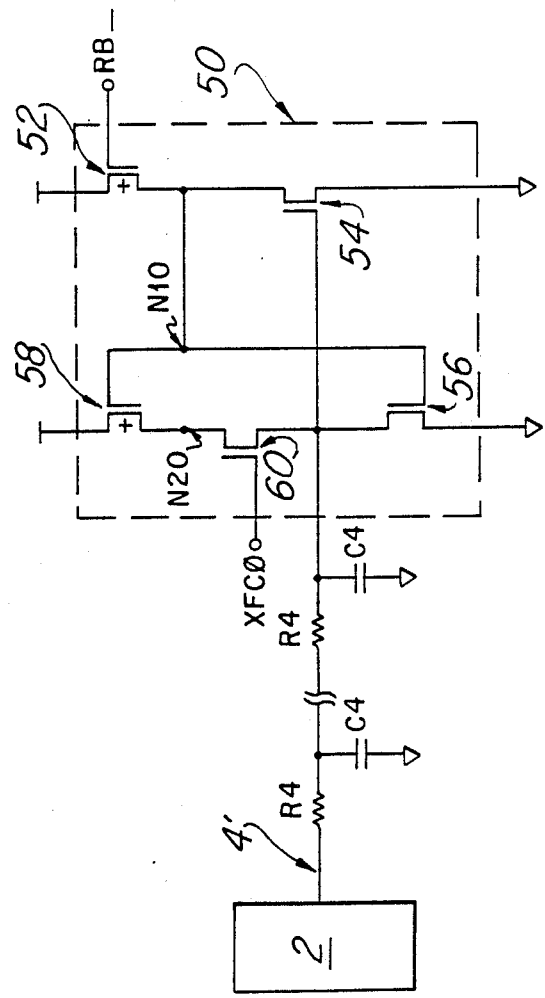
FIG. 2 is a schematic drawing of one embodiment of a pull-up circuit according to the invention.
Figure 3:
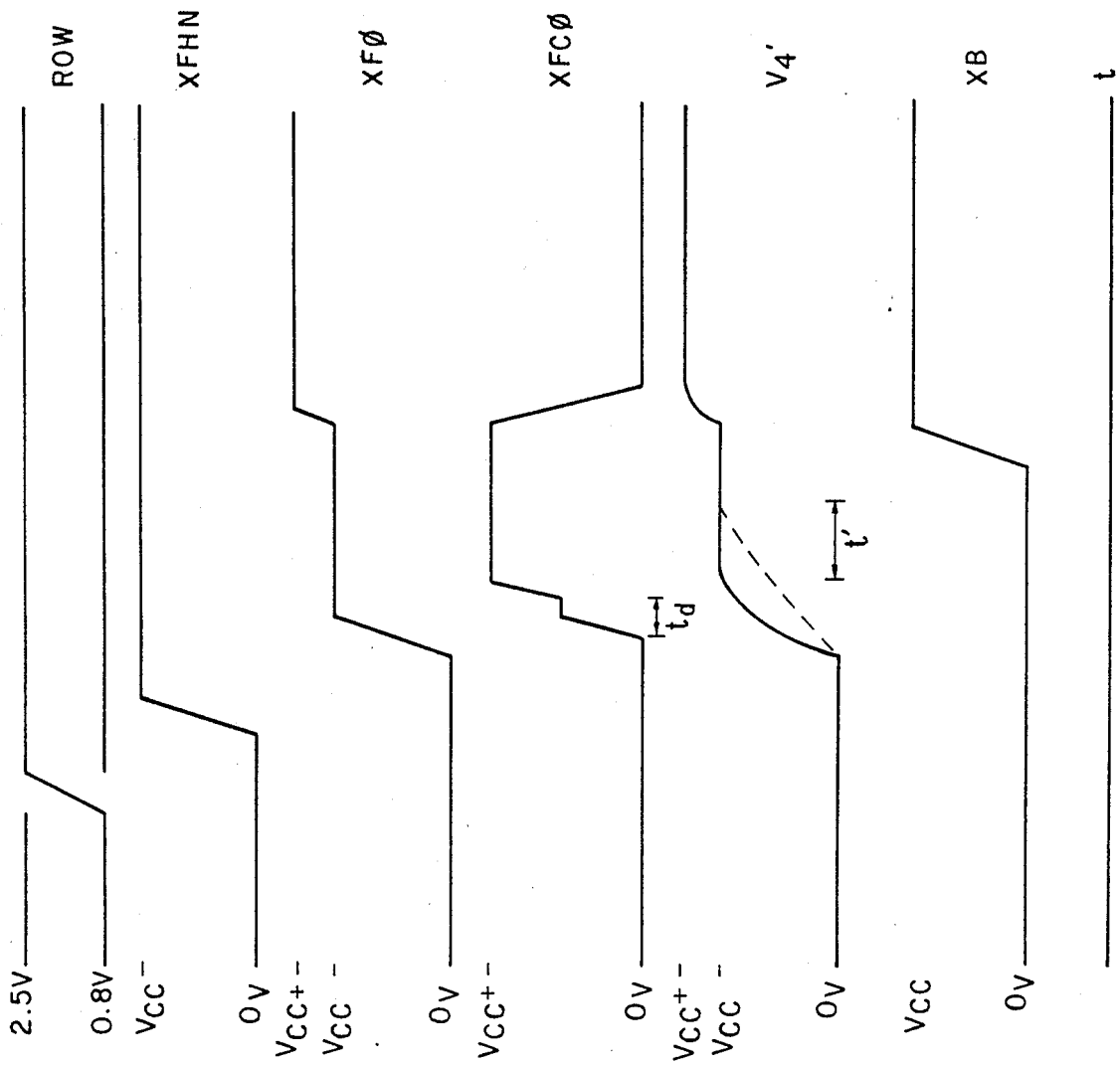
FIG. 3 is a timing diagram illustrating the operation of the circuit of FIG. 2.

Referring now to FIG. 2, a preferred embodiment of the invention is shown as implemented in pull-up circuit 50 associated with word line 4'. Pull-up circuit 50 consists of p-channel transistor 52 having its source powered by $V_{cc}$ and its drain connected to node N10, with its gate controlled by precharge signal RB_, similarly to transistor 22 of bleeder circuit 6 shown in FIG. 1. N-channel transistor 54 has its drain connected to node N10, its source at ground, and its gate connected to the end of word line 4'. N-channel transistor 56 has its drain connected to the end of word line 4', its source at ground, and its gate connected to node N10; as will be explained in detail below, transistor 56 will perform the function of bleeder circuit 6 of insuring that unselected ones of word lines 4 will be held low. P-channel transistor 58 has its source connected to $V_{cc}$, its gate connected to node N10, and its drain connected to node N20. N-channel transistor 60 has its drain connected to node N20, its source connected to the end of word line 4', and its gate controlled by a control signal derived from whichever lower factor signal XF0 through XF3 controls this particular word line 4; FIG. 2 shows word line 4', with control signal XFC0 controlling the gate of transistor 60. Control signal XFC0 is generated from lower factor signal XF0 by a circuit which will be described in detail below; the characteristics of control signal XFC0 are shown in FIG. 3. As will be seen below, pull-up circuit 50 will serve to assist the charging of word line 4', in conjunction with word line driver circuit 2.

In operation, during the precharge portion of the memory cycle, precharge signal RB_ goes to a low logic level, causing transistor 52 to pull node N10 toward $V_{cc}$. This will turn transistor 56 on, keeping word line 4 at ground since word line driver 2 is inactive during precharge, similarly as discussed above relative to bleeder circuit 6. Also during this time, control signal XFC0 is low, since lower factor signal XF0 is low at this time; however, control signal XFC0 may instead be held at an intermediate level above the threshold voltage of transistor 60, in order to reduce the time required to charge the gate of transistor 60 if selected. Node N20 is discharged either from the prior cycle, or because of control signal XFC0 being at its intermediate level; the state of node N20 following precharge is a "don't care" relative to the operation of pull-up circuit 50, as long as transistor 58 is turned off at this time. Transistor 58 is turned off by node N10 being precharged to a high level. After precharge signal RB_ returns high, node N10 remains charged to a high level, awaiting the active portion of the memory cycle.

For a selected word line 4, in this example word line 4', FIG. 3 illustrates the operation of the circuit of FIG. 2. The row address makes its transition as shown in FIG. 3 by the waveform marked ROW. Responsive to the transition of the row address to indicate the desired row (i.e., the row corresponding to word line 4'), higher factor signals XF4 through XFn make the low-to-high transition accordingly, as shown in FIG. 3 by the waveform marked XFHN. As discussed above relative to FIG. 1, the one of lower factor signals XF0 through XF3 corresponding to the one of four rows to be selected makes its low-to-high transition subsequent to the low-to-high transition of higher factor signals XF4 through XFn. For the example of selecting word line 4', the transition of lower factor signal XF0 is shown in FIG. 3 by the waveform marked XF0; the transition of lower factor signal XF0 occurs after the transition of higher factor signals XF4 through XFn, as discussed above, to accomplish the bootstrapping required to charge word line 4' to the full level of lower factor signal XF0. Control signal XFC0 makes a transition from its low level to a high level a short time after the transition of lower factor signal XF0, turning on transistor 60. As word line 4' charges responsive to lower factor signal XF0, as discussed above relative to FIG. 1 and as shown in FIG. 3 by the waveform marked $V_{4'}$, transistor 54 is turned on when the voltage of word line 4' exceeds the threshold voltage. When transistor 54 turns on, node N10 is discharged, and transistor 56 is turned off, preventing the voltage of word line 4' from being discharged to ground. As node N10 is discharged transistor 58 is turned on, causing word line 4' to be charged from $V_{cc}$ through transistors 58 and 60. It is preferable to bootstrap the voltage of control signal XFC0 to a level above $V_{cc}$, as shown in FIG. 3 by the waveform marked XFC0 going to the voltage level $V_{cc}+$, so that word line 4' may be fully charged to $V_{cc}$ without a threshold drop through transistor 60. The effect of the charging of word line 4' from $V_{cc}$ through transistors 58 and 60 is shown in FIG. 3 by the waveform $V_{4'}$, representative of the voltage of word line 4'. The solid portion of waveform $V_{4'}$ shows the response of word line 4' to lower factor signal XF0 utilizing pull-up circuit 50, according to the invention, while the dashed portion of waveform $V_{4'}$ is representative of the response of word line 4' to lower factor signal XF0 utilizing bleeder circuit 6, according to the prior art. The time indicated in FIG. 3 as t' is indicative of the difference in time required to charge word line 4' to a level approximately at $V_{cc}$; this time difference t' is a direct reduction in the read access time of the memory device utilizing pull-up circuit 50, according to the invention, relative to a memory device utilizing bleeder circuit 6, according to the prior art.

It should be noted that the precharged condition of pull-up circuit 50 will be maintained during the active portion of the cycle for those word lines 4 which are not selected by lower factor signal XF0, since such word lines 4 will not be charged by driver circuit 2, and since the transistor 60 associated therewith will not be turned on by control signal XFC0. In addition, even though control signal XFC0 will go to a high level for one of transistors 60 in those pull-up circuits 50 associated with word line groups not responsive to the same higher factor signal combination as the group containing word line 4', the word line 4 associated with lower factor signal XF0 in such groups is not selected because of the different higher factor signals XF4 through XFn required for selection, precluding its associated word line 4 from being charged to a high level. As long as word line 4 remains low, transistor 54 will not turn on, and such pull-up circuits 50 will remain substantially in the precharged condition, with node N10 precharged high, transistor 56 turned on, and transistors 58 and 54 turned off, regardless of the logic state of control signal XFC0.

Referring still to FIG. 3, the waveform marked XF0 indicates that factor signal XF0 makes a transition from its high logic level to a boosted level, after word line 4' has been charged to approximately $V_{cc}$. As disclosed in U.S. Pat. No. 4,533,843, issued on August 6, 1985 to McAlexander, White and Rao and assigned to Texas Instruments, Inc., it is useful to bootstrap the word line voltage after the transfer gates have been energized by word line 4' and the sensing operation complete, so that a full "1" level may be written into the storage cells without a threshold voltage drop across the transfer gates. The bootstrapping of word line 4' is done by bootstrapping the selected one of lower factor signals XF0 through XF3, in this example lower factor signal XF0, at a point in time later in the cycle. Control signal XFC0 may be driven low at this time, turning off transistor 60, since its function of assisting the drive of word line 4' so as to shorten the read access time of the memory device is complete. In addition, since control signal XFC0 may be at least a threshold voltage greater than $V_{cc}$, appearing at node N20, as the voltage of word line 4' itself is driven above $V_{cc}$, transistor 60 will conduct, further loading the circuit boosting word line 4'; by turning transistor 60 off, the boosted voltage of word line 4' will not discharge to $V_{cc}$ through transistors 58 and 60. The high to low transition of control signal XFC0 is shown in FIG. 3 as occurring approximately concurrently with the boosting of lower factor signal XF0. FIG. 3 further illustrates the response of word line 4' to lower factor signal XF0, in the waveform marked $V_{4'}$.

Figure 4:
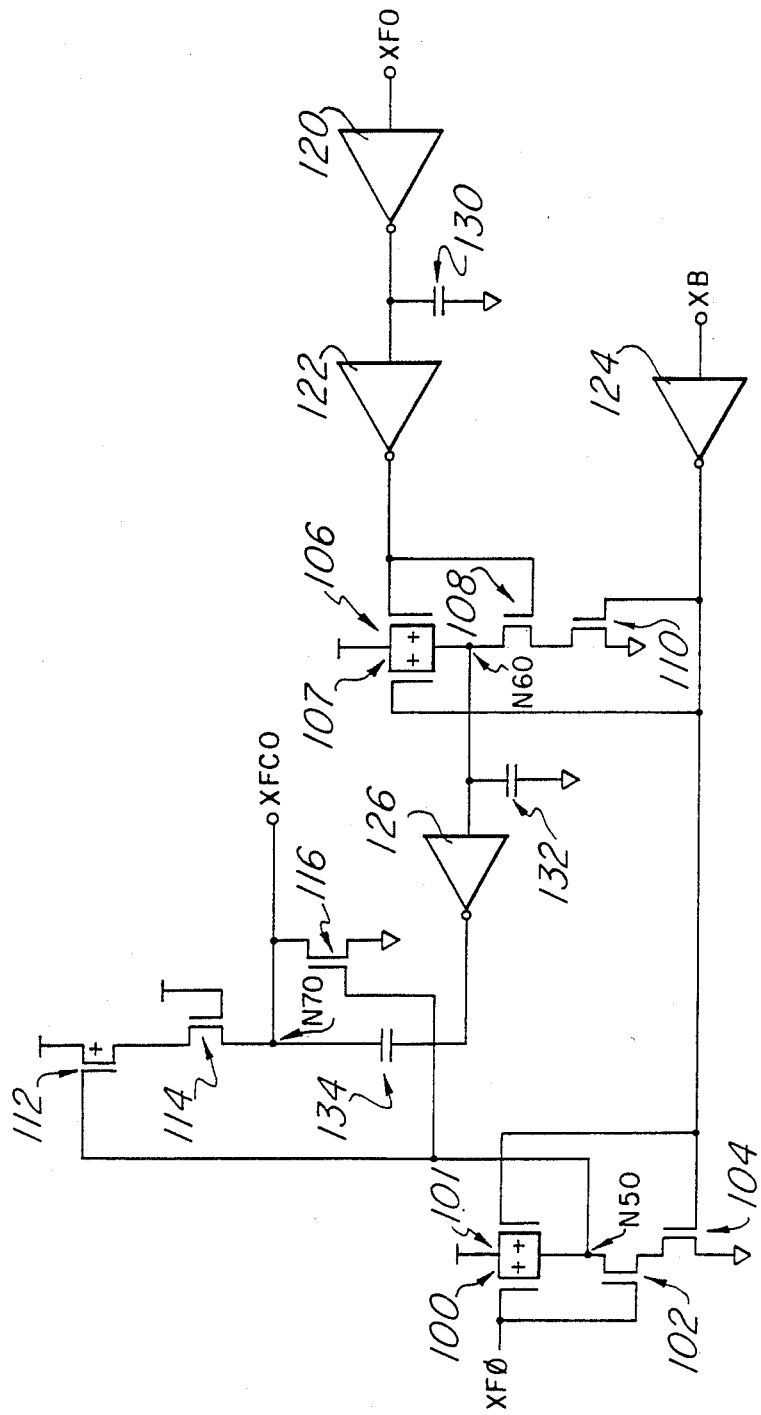
FIG. 4 is a schematic drawing of a circuit for generating a control signal utilized in the circuit of FIG. 2.

Referring now to FIG. 4, a circuit for generating control signal XFC0 (which, in general for all word lines, is the circuit for generating control signal XFCLN) responsive to lower factor signal XF0 (in general, lower factor signal XFLN) will be described. This circuit is duplicated for each lower factor signal XFLN (in this example, each of lower factor signals XF0, XF1, XF2, and XF3 each are associated with such a circuit). Lower factor signal XF0, generated by the row address decoder as described above, is connected to the gate of p-channel transistor 100 and n-channel transistor 102, and is also connected to the input of inverter 120. Inverter 120 is preferably a CMOS inverter comprised of a pair of transistors of opposite channel conductivity-type, as is well known in the art, since the memory device described herein has both p-channel and n-channel MOS transistors; inverter 120 may, of course, be any other type of well known logic inverter circuit without affecting the operability of the circuit of FIG. 4. The source of transistor 100 is connected to $V_{cc}$, and the drains of transistors 100 and 102 are connected together at node N50; the source of transistor 102 is connected to the drain of n-channel transistor 104. The output of inverter 120 is connected to the input of inverter 122, and to one plate of delay capacitor 130. The output of inverter 122 is connected to the gate of p-channel transistor 106 and n-channel transistor 108. The source of transistor 106 is connected to $V_{cc}$, and the drains of transistor 106 and 108 are connected together at node N60, with the source of transistor 108 connected to the drain of n-channel transistor 110. Control signal XB appears at the input of inverter 124, the output of which appears at the gate of transistor 104, the gate of p-channel transistor 107, the gate of p-channel transistor 101, and the gate of transistor 110. The sources of n-channel transistors 104 and 110 are connected to ground, and transistors 101 and 107 have their source-to-drain paths in parallel with those of transistors 100 and 106, respectively. Node N60 is connected to the input of inverter 126 and to one plate of delay capacitor 132. The output of inverter 126 is connected to one plate of capacitor 134, the other plate of capacitor 134 being node N70, at which control signal XFC0 appears. Node N50 is connected to the gate of p-channel transistor 112, which has its source connected to $V_{cc}$ and its drain connected to the drain of n-channel transistor 114. The gate of transistor 114 is tied to $V_{cc}$, and its source is connected to node N70. N-channel transistor 116 has its gate connected to node N50, and has its drain connected to node N70 and its source at ground.

In operation, during the precharge portion of the memory cycle, lower factor signal XF0 and control signal XB are at a low logic state. This causes transistor 100 to conduct, pulling node N50 high. Transistor 104 is conductive, due to the high state of the output of inverter 124, but this is of no effect since transistor 102 is turned off by lower factor signal XF0. The output of inverter 122 is also at a low state, since lower factor signal XF0 is low, the output of inverter 122 being lower factor signal XF0 twice-inverted. As a result, transistor 106 conducts, pulling node N60 high; as with node N50, this occurs even though the output of inverter 124 is high. Transistor 110 is conductive, similarly to transistor 104, but since transistor 108 is turned off, this is of no effect at this time. The output of inverter 126 is at a low state due to the high level at node N60. P-channel transistor 112 is turned off since node N50 is high, and node N70 is low, since transistor 116 is turned on by node N50 being high. This in turn will pull control signal XFC0 to a low level. Therefore, after precharge, no voltage is stored across capacitor 134, since both node N70 and the output of inverter 126 are at low states, and control signal XFC0 is at a low level.

In the active cycle, if word line 4', associated with lower factor signal XF0 is to be selected, lower factor signal XF0 will go to a high state. This causes node N50 to be pulled low, since the high output of inverter 124 has turned on transistor 104, and since a high state of lower factor signal XF0 will turn on transistor 102 and turn off transistor 100. As node N50 goes low, transistor 112 is turned on and transistor 116 is turned off, allowing node N70 to be charged from $V_{cc}$ through transistors 112 and 114. As a result, control signal XFC0 will be charged to a maximum level of $V_{cc}$ minus the threshold voltage drop across transistor 114, transistor 114 being in its saturation region. In addition, as lower factor signal XF0 goes high, the output of inverter 120 goes low, but is delayed due to the presence of delay capacitor 130. As the output of inverter 120 finally does go low, the output of inverter 122 will go high as a result, turning off transistor 106 and discharging node N60 to ground though transistors 108 and 110, transistor 110 being conductive due to the output of inverter 124 being high. However, the discharging of node N60 will be delayed due to the effect of delay capacitor 132, causing the output of inverter 126 going high, in response to node N60, to be similarly delayed.

The delay in charging the output of inverter 126 allows for control signal XFC0 to be bootstrapped to a level greater than $V_{cc}$ by at least the threshold voltage of transistor 60 shown in FIG. 2, so that word line 4' can be charged to a full $V_{cc}$ level by pull-up circuit 50. As described above, node N70 is initially charged to $V_{cc}-V_t$ ($V_t$ being the threshold voltage of transistor 114) before the output of inverter 126 reaches a high level, due to delay capacitors 130 and 132. Therefore, the voltage across capacitor 134 will at a value close to $V_{cc}-V_t$ before the output of inverter 126 switches. When the output of inverter 126 switches from ground to approximately $V_{cc}$, because the voltage across capacitor 134 cannot change instantaneously, the voltage at node N70 will be bootstrapped to a voltage approximately at $2V_{cc}-V_t$, which is above $V_{cc}$ by more than the threshold voltage of transistor 60 shown in FIG. 2. In FIG. 3, the waveform marked XFC0 shows the initial charging of node N70 to an intermediate voltage, followed by the bootstrapping to the higher voltage after the time delay labeled $t_d$. Node N70 remains at this bootstrapped voltage because of the isolating effect of transistor 114. Since the gate of transistor 114 is connected to $V_{cc}$, and since the drain of transistor 114 is at $V_{cc}$ because transistor 112 is turned on at this time, as the source of transistor 114 (at node N70) is bootstrapped to a voltage above $V_{cc}$, transistor 114 is turned off because its gate voltage does not exceed either its drain or source voltage by an amount greater than its threshold voltage. Since transistor 114 is turned off, no discharge paths exist for the bootstrapped voltage of node N70, allowing control signal XFC0 to remain at its boosted voltage for a period of time sufficient to allow word line 4' to be charged fully to $V_{cc}$ through transistors 58 and 60, as shown in FIG. 2.

At a predetermined point in time subsequent to lower factor signal XF0 going to its high state as it selects the desired row, it is useful to boost the voltage of the selected word line 4 by boosting the voltage of lower factor signal XF0, as discussed above. Control signal XB is generated in the memory device to accomplish this by techniques well known in the art. However, as discussed above relative to FIG. 2, it is useful to pull control signal XFC0 to a low level as the voltage of word line 4 is boosted, so that the boosting effect is not affected by the conduction of transistor 60. Referring to FIG. 3, control signal XB goes from a low to a high state at a point in time after the selected word line 4 is charged to approximately $V_{cc}$. Referring now to FIG. 4, as control signal XB goes to a high level, the output of inverter 124 goes to a low level. This turns off transistor 104 and turns on transistor 101, causing node N50 to be pulled high; As node N50 goes high, transistor 116 turns on, discharging the voltage of node N70, and control signal XFC0, to ground; transistor 112 is also turned off at this time to prevent a virtual short circuit from $V_{cc}$ to ground. In addition, transistor 107 is turned on and transistor 110 is turned off as the output of inverter 124 goes low, causing the output of inverter 126 to go low, discharging the lower plate of capacitor 134.

Figure 5:
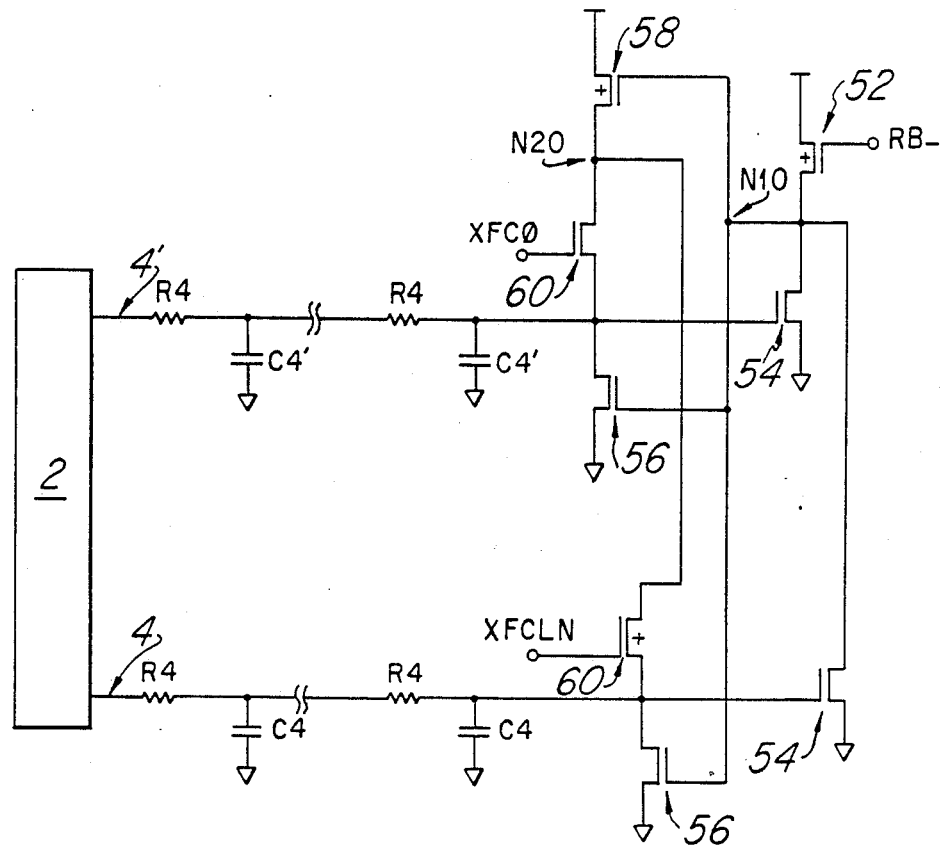
FIG. 5 is a schematic drawing of the circuit of FIG. 2, shown as shared among a plurality of word lines.

Referring now to FIG. 5, the embodiment of the invention as described above is shown in a manner wherein portions of pull-up circuit 50 are shared by a plurality of word lines 4. It is convenient from a layout standpoint to share p-channel transistors 52 and 58 among the word lines having a common address represented by higher factor signals XF4 through XFn, although additional configurations sharing transistors 52 and 58 will also be operable. As shown in FIG. 5, nodes N10 and N20 are common for word lines 4, transistors 54, 56 and 60 necessarily being separate for each word line 4, transistor 54 being responsive to the voltage of each word line 4, transistor 60 being responsive to control signal XFCLN corresponding to the individual word line 4, and transistor 56 being responsive to transistor 54. Two such word lines 4 sharing transistors 52 and 58 are shown in FIG. 5, it being understood that additional word lines 4 may share transistors 52 and 58 to the extent practicable from various decoding schemes.

Relative to the embodiments of the invention illustrated in FIGS. 2 and 5, it should be noted that node N10 is precharged to $V_{cc}$ prior to the selection of a given word line 4. Since transistor 56 is fully turned on by node N10 being at $V_{cc}$, the selected word line 4 (e.g., word line 4') must be charged up by word line driver circuit 2 with transistor 56 conducting the charge to ground at the end of word line 4', until word line 4' is above the threshold voltage of transistor 54, which pulls node N10 low and turns transistor 56 off. The conduction of transistor 56, which increases the time required to charge word line 4', may be reduced by increasing the channel length of transistor 56, but such an increase will necessarily increase the capacitance of node N10, causing its response to be accordingly slower, especially since a plurality of transistors 56 may share the same node N10.

Figure 6:
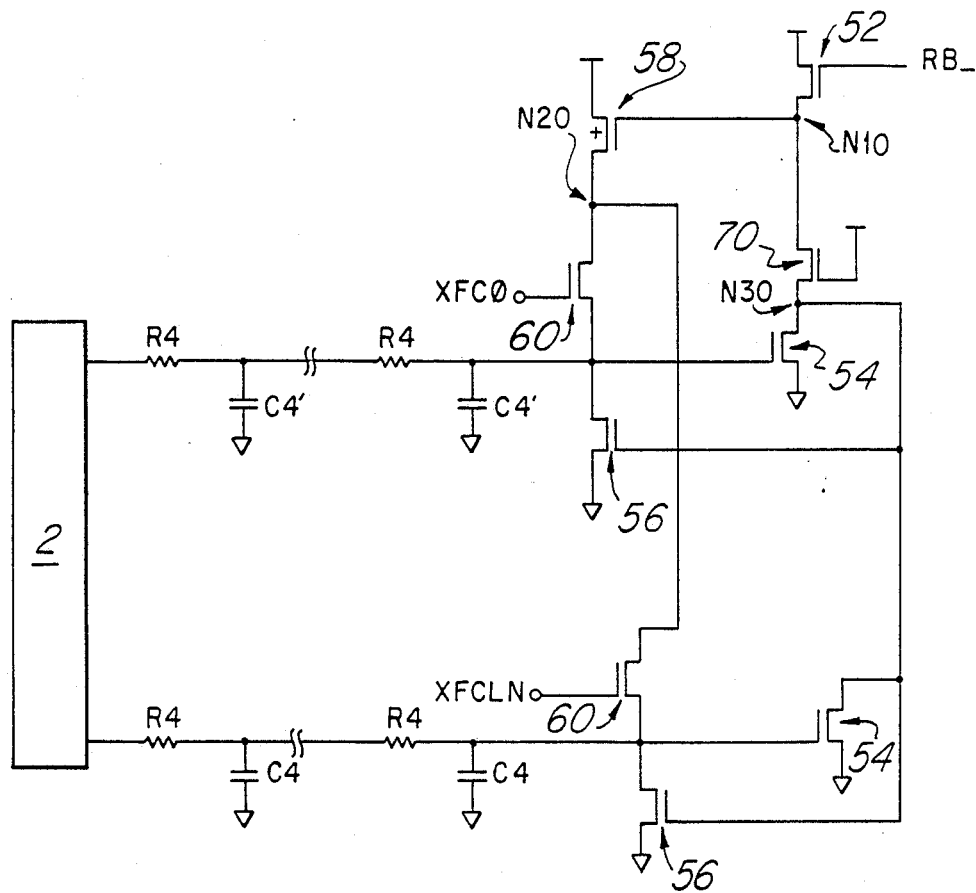
FIG. 6 is a schematic drawing of another embodiment of a pull-up circuit according to the invention.

Referring to FIG. 6, a preferred embodiment of the invention is schematically illustrated which solves the above problem. As shown above in FIG. 5, certain of the transistors are shared among a plurality of word lines 4. N-channel transistor 70 is shown in the circuit of FIG. 6 as being shared by a plurality of word lines 4; the drain of transistor 70 is connected to the drain of transistor 52, the source of transistor 70 is connected to the drain of transistors 54 associated with each word line 4, and the gate of transistor 70 is connected to $V_{cc}$. Node N30 refers to the node between the source of transistor 70 and the drain of transistor 54. Compared to the circuit of FIG. 5, the gate of transistor 56 associated with each word line 4 is connected to node N30, which is at the drain of transistor 54 as in FIG. 2, but which is isolated from the drain of transistor 52 and the gate of transistor 58 by transistor 70; the drain of transistor 52 and the gate of transistor 58 remaining connected to node N10.

In operation, n-channel transistor 70 presents a threshold voltage drop to the precharged voltage at node N10, since transistor is in the saturation region when its drain and gate voltages are equal (in this case, at $V_{cc}$). This causes node N30 to be at $V_{cc}-V_t$ ($V_t$ being the threshold voltage of transistor 70), when node N10 is precharged to $V_{cc}$. The presence of transistor 70 thus allows the gate of transistor 58 to be precharged to $V_{cc}$, fully turning transistor 58 off, while allowing the gate of transistor 56 to be at a voltage lower than $V_{cc}$ after precharge. The lower gate voltage on transistor 56 makes transistor 56 less conductive as word line 4' begins charging up after being selected, in turn causing the voltage of word line 4' to be charged to a level above the threshold voltage of transistor 54 more quickly than in the embodiments of the invention illustrated in FIGS. 2 and 5. Depending upon the values of $V_{cc}$ and $V_t$, and the characteristics of transistors 56 and 70, it may of course be preferable to connect a plurality of transistors 70 between node N10 and node N30, in order to optimize the charging of word line 4'.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. In a circuit for driving a load from a first logic state to a second logic state, wherein the load comprises a line conductor having a first end and a second end, and having a resistance and a capacitance between its time end and its second end of said load and a pull-up circuit connected to the second end of said load, said pull-up circuit comprising:
   a precharger responsive to a clock signal, for precharging a precharged node prior to said load being driven to its second logic state;
   a discharger, responsive to said load being driven from said first logic state to a voltage between said first logic state and said second logic state, for discharging said precharged node; and
   a driver, responsive to said precharged node being discharged, for driving said second end of said load from a first power supply having a voltage corresponding to said second logic state.

2. The combination of claim 1, wherein said driver drives a driving node from said first power supply; and further comprising:
   a coupler, responsive to a select signal, for coupling said driving node to said second end of said load, so that, responsive to said precharged node being discharged by said discharger, said second end of said load is driven by said first power supply to said second logic state when said select signal is enabled.

3. The combination of claim 2, wherein said circuit drives said load to a voltage exceeding the voltage of said first power supply; and further comprising:
   a disabler for disabling said select signal responsive to said circuit driving said load to a voltage exceeding the voltage of said first power supply, so that said coupler disconnects said second end of said load from said driving node.

4. The combination of claim 1, wherein said discharger comprises a first transistor having a source-to-drain path connected between said precharged node and a second power supply, said second power supply having a voltage corresponding to said first logic state, and having its gate connected to the second end of said load.

5. The combination of claim 4, wherein said precharger comprises a second transistor having a source-to-drain path connected between said first power supply and said precharging node, and having a gate connected to a precharge signal, so that said source-to-drain path of said second transistor is made conductive responsive to said precharge signal, thereby allowing said precharged node to be driven by said first power supply to a voltage corresponding to said second logic state.

6. The combination of claim 5, wherein said driver drives a driving node from said first power supply; and further comprising:
   a coupler, responsive to a select signal, for coupling said driving node to said second end of said load, so that, responsive to said precharged node being discharged by said discharger, said second end of said load is driven by said first power supply to said second logic state when said select signal is enabled.

7. The combination of claim 6, wherein said driver circuit drives said load to a voltage exceeding the voltage of said first power supply; and further comprising.
   a disabler for disabling said select signal responsive to said driver circuit driving said load to a voltage exceeding the voltage of said first power supply, so that said coupler disconnects said second end of said load from said driving node.

8. The combination of claim 6, wherein said driver comprises a third transistor having a source-to-drain path connected between said first power supply and said driving node, and having a gate connected to said precharged node, said third transistor having a channel-conductivity type opposite that of said first transistor.

9. The combination of claim 8, wherein said coupler comprises a fourth transistor having a source-to-drain path connected between said driving node and said second end of said load, and having a gate connected to said select signal, so that said driving node is connected to the second end of said load, responsive to said select signal.

10. The combination of claim 1, further comprising;
    a coupler, responsive to said precharged node being precharged by said precharger, for connecting said second end of said load to a second power supply, said second power supply having a voltage corresponding to said first logic state.

11. The combination of claim 10, wherein said discharger comprises a first transistor having a source-to-drain path connected between said precharged node and said second power supply, said second power supply having a voltage corresponding to said first logic state, and having its gate connected to the second end of said load;
    and wherein said coupler comprises a fifth transistor having a source-to-drain path connected between the second end of said load and said second power supply, and having a gate connected to said precharged node.

12. The combination of claim 11, wherein said precharger comprises:
    a second transistor having a source-to-drain path connected between said first power supply and an intermediate precharged node, and having a gate connected to a precharge signal, so that said source-to-drain path is made conductive responsive to said precharge signal, thereby allowing said intermediate precharged node to be driven by said first power supply node to a voltage corresponding to said second logic state; and
    a voltage controller, connected between said intermediate precharged node and said precharged node, for causing the voltage of said precharged node to have a lower magnitude than the voltage of said intermediate precharged node.

13. The combination of claim 12, wherein said driver comprises a third transistor having a source-to-drain path connected between said first power supply and a driving node, and having a gate connected to said intermediate precharged node, said third transistor having a channel-conductivity type opposite that of said first transistor and said fifth transistor.

14. In a memory device comprised of a plurality of memory cells arranged in rows and columns, wherein an address decoder selects a row of said memory cells responsive to a row address signal, and wherein the selected row is addressed by a word line associated with said row being driven from a first logic state to a second logic state, said word lines of unselected rows remaining at said first logic state, each said word line having a first end and a second end with a capacitance and resistance distributed therebetween, the combination of a driver circuit connected to the first end of a first word line and a pull-up circuit connected to the second end of said first word line, said pull-up circuit comprising:

- a precharger, responsive to a clock signal, for precharging a precharged node prior to said first word line being driven to its second logic state;
- a first discharger, responsive to said first word line being driven from said first logic state to a voltage between said first logic state and said second logic state, for discharging said precharged node;
- a driver, responsive to said precharged node being discharged, for driving a driving node from a first power supply having a voltage corresponding to said second logic state; and
- a first coupler, responsive to a first factor signal from said address decoder, for coupling said driving node to said second end of said first word line, so that, responsive to said precharged node being discharged by said first discharger, said second end of said first word line is driver by said first power supply to said second logic state when said first factor signal selects said first word line.

15. The combination of claim 14, wherein another row in said memory is addressed, when selected by said address decoder responsive to a row address signal, by a second word line being driven from said first logic state to said second logic state; and further comprising:

- a second discharger, responsive to said second word line being driven from said first logic state to a voltage between said first logic state and said second logic state, for discharging said precharged node; and
- a second coupler, responsive to a second factor signal from said address decoder, for coupling said driving node to said second end of said second word line, so that, responsive to said precharged node being discharged by said second discharger, said second end of said second word line is driven by said first power supply to said second logic state when said second factor signal selects said second word line;
- wherein said address decoder is adapted to generate either said first factor signal or said second factor signal, so that either said first word line or said second word line, respectively, is selected.

16. The combination of claim 15, wherein said first discharger comprises a first transistor having a source-to-drain path connected between said precharged node and a second power supply, said second power supply having a voltage corresponding to said first logic state, and having its gate connected to the second end of said first word line;

and wherein said second discharger comprises a second transistor having a source-to-drain path connected between said precharged node and said second power supply, and having its gate connected to the end of said second word line.

17. The combination of claim 15, further comprising:

- a first connector, responsive to said precharged node being precharged by said precharger, for connecting said second end of said first word line to a second power supply, said second power supply having a voltage corresponding to said first logic state; and
- a second connector, responsive to said precharged node being precharged by said precharger, for connecting the second end of said second word line to said second power supply.

18. The combination of claim 17, wherein said first discharger comprises a first transistor having a source-to-drain path connected between said precharged node and a second power supply, said second power supply having a voltage corresponding to said first logic state, and having its gate connected to the second end of said first word line;

wherein said second discharger comprises a second transistor having a source-to-drain path connected between said precharged node and said second power supply, and having its gate connected to the second end of said second word line, wherein said first connector comprises a third transistor having a source-to-drain path connected between the second end of said first word line and said second power supply, and having a gate connected to said precharge node;

and wherein said second connector comprises a fourth transistor having a source-to-drain path connected between the second end of said second word line and said second power supply, and having a gate connected to said precharged node.

19. The combination of claim 18, wherein said precharger comprises:

- a fifth transistor having a source-to-drain path connected between said first power supply node and an intermediate precharged node, and having a gate connected to a precharge signal, so that said source-to-drain path is made conductive responsive to said precharge signal, thereby allowing said intermediate precharged node to be driven by said first power supply to a voltage corresponding to said second logic state; and
- a voltage controller, connected between said intermediate precharged node and said precharged node, for causing the voltage of said precharged node to have a lower magnitude than the voltage of said intermediate precharged node.

20. The combination of claim 19, wherein said driver comprises a sixth transistor having a source-to-drain path connected between said first power supply and a driving node, and having a gate connected to said intermediate precharge node, said sixth transistor having a channel-conductivity type opposite that of said first transistor, said second transistor, said third transistor and said fourth transistor.

* * * * *